United States Patent
Malvaranta et al.

(10) Patent No.: US 11,335,766 B2
(45) Date of Patent: May 17, 2022

(54) THIN FILM DISPLAY ELEMENT AND MANUFACTURING

(71) Applicant: Lumineq Oy, Espoo (FI)

(72) Inventors: Pertti Malvaranta, Helsinki (FI); Asta Ollila, Helsinki (FI); Jukka Lammi, Espoo (FI); Kari Härkönen, Espoo (FI); Mikko Saikkonen, Espoo (FI)

(73) Assignee: Lumineq Oy, Espoo (FI)

( * ) Notice: Subject to any disclaimer, the term of this patent is extended or adjusted under 35 U.S.C. 154(b) by 218 days.

(21) Appl. No.: 16/496,017

(22) PCT Filed: Mar. 22, 2018

(86) PCT No.: PCT/FI2018/050216
§ 371 (c)(1),
(2) Date: Sep. 20, 2019

(87) PCT Pub. No.: WO2018/172617
PCT Pub. Date: Sep. 27, 2018

(65) Prior Publication Data
US 2020/0035777 A1    Jan. 30, 2020

(30) Foreign Application Priority Data
Mar. 23, 2017  (FI) ..................... 20175274

(51) Int. Cl.
*H01L 27/32* (2006.01)
*H01L 27/15* (2006.01)

(52) U.S. Cl.
CPC .......... *H01L 27/3288* (2013.01); *H01L 27/15* (2013.01); *H01L 27/156* (2013.01); *H01L 27/3223* (2013.01); *H01L 27/3237* (2013.01)

(58) Field of Classification Search
CPC ... H01L 27/15; H01L 27/156; H01L 27/3223; H01L 27/3237; H01L 27/3288
See application file for complete search history.

(56) References Cited

U.S. PATENT DOCUMENTS

2005/0012455 A1  1/2005 Lee et al.
2007/0138954 A1  6/2007 Takayama et al.
(Continued)

FOREIGN PATENT DOCUMENTS

CN  1708852 A   12/2005
CN  102200596 A  9/2011
(Continued)

OTHER PUBLICATIONS

Extended European Search Report for European Patent Application No. 18771763.2 dated Dec. 2, 2020, 5 pages.
(Continued)

*Primary Examiner* — Matthew C Landau
*Assistant Examiner* — Mark Hatzilambrou
(74) *Attorney, Agent, or Firm* — Merchant & Gould P.C.

(57) ABSTRACT

A transparent thin film display element (100) with a display region(101), and a transition region (105) having a first edge (106) bordering the display region and a second edge (107) opposite to the first edge, the transparent display element having a layer stack (103) comprises: a first conductor layer (110); a second conductor layer (120); and an emissive layer (130) superposed between the first and the second conductor layers and configured to emit light upon electrical current flowing through the emissive layer between the first and the second conductor layers. At least one layer (120) of a group comprising the first and the second conductor layers and the emissive layer has, in the transition region (105), a first coverage at the first edge (106), a second coverage lower than the first coverage at the second edge (107), and an intermediate coverage lying between the first and the second coverage.

15 Claims, 4 Drawing Sheets

(56) References Cited

U.S. PATENT DOCUMENTS

| | | | | |
|---|---|---|---|---|
| 2009/0140647 | A1* | 6/2009 | Chung | H01L 27/3223 313/504 |
| 2014/0084258 | A1* | 3/2014 | Choi | H01L 51/5203 257/40 |
| 2015/0189718 | A1* | 7/2015 | Harkonen | H05B 33/28 313/503 |
| 2016/0266672 | A1 | 9/2016 | Inagaki et al. | |
| 2017/0031389 | A1 | 2/2017 | Yoo et al. | |
| 2018/0137796 | A1* | 5/2018 | Pirtskhlava | G09F 9/33 |

FOREIGN PATENT DOCUMENTS

| CN | 104064579 A | 9/2014 |
|---|---|---|
| CN | 106409149 A | 2/2017 |
| EP | 3603341 B1 | 9/2021 |
| JP | 2011-183916 A | 9/2011 |
| WO | WO 2005/067352 A1 | 7/2005 |
| WO | WO 2013/145226 A1 | 10/2013 |
| WO | WO 2014/009601 A1 | 1/2014 |
| WO | WO 2015/193868 A2 | 9/2016 |

OTHER PUBLICATIONS

International Search Report for corresponding International Patent Application No. PCT/FI2018/050216 dated Jul. 6, 2018, 6 pages.
Written Opinion of the International Searching Authority for corresponding International Patent Application No. PCT/FI2018/050216 dated Jul. 6, 2018, 7 pages.
Finnish Office Action for corresponding Finnish Patent Application No. 20175274 dated Oct. 25, 2017, 1 page.
Ono, Y., Electroluminescent Displays, World Scientific Publishing Co., Chapters 3, 5 and 8, 18 pages (1995).
Chinese Office Action for CN Application No. 201880019800.4 dated Nov. 3, 2021 (11 pages, with English translation).

* cited by examiner

500

┌─────────────────────────────────────────────┐
│ FORMING A FIRST CONDUCTOR LAYER, POSSIBLY   │
│ WITH A CHANGING COVERAGE IN THE TRANSITION  │
│ REGION                                      │
└─────────────────────────────────────────────┘
                            501

┌─────────────────────────────────────────────┐
│ FORMING AN EMISSIVE LAYER ON THE FIRST      │
│ CONDUCTOR LAYER, POSSIBLY WITH A CHANGING   │
│ COVERAGE IN THE TRANSITION LAYER            │
└─────────────────────────────────────────────┘
                            502

┌─────────────────────────────────────────────┐
│ FORMING A SECOND CONDUCTOR LAYER ON THE     │
│ EMISSIVE LAYER, POSSIBLY WITH A CHANGING    │
│ COVERAGE IN THE TRANSITION LAYER            │
└─────────────────────────────────────────────┘
                            503

Fig. 5

THIN FILM DISPLAY ELEMENT AND MANUFACTURING

This application is a National Stage Application of PCT/FI2018/050216, filed 22 Mar. 2018, which claims benefit of Application Serial No. 20175274, filed 23 Mar. 2017 in Finland and which applications are incorporated herein by reference. To the extent appropriate, a claim of priority is made to each of the above disclosed applications.

FIELD OF THE INVENTION

The present invention relates to transparent thin film displays, such as inorganic thin film electroluminescent TFEL displays and thin film transparent organic light emitting diode OLED displays. In particular, the present invention relates to visibility of the operational layers of transparent displays.

BACKGROUND OF THE INVENTION

Transparent displays, such as electroluminescent displays and OLED displays are widely used in various applications.

The transparency of such displays allows them to be used, in particular, in applications where only the displayed information produced by emitting light from the display is desired to be visible to an observer, whereas the rest of the display, and also the emissive parts thereof when in non-emitting state, should be imperceptible. Examples of such applications include Head-Up Displays HUDs integrated into the windshields or windscreen of aircrafts, vehicles, or work machines, and displays integrated into display windows or display cases and different medical and other types of devices that encompass a transparent casing.

In many of those applications, a transparent display or display element is integrated within or onto a larger-area transparent panel such as a window, the display thus covering only part of the area of the transparent panel. On the other hand, also in the case of a "transparent" display, one or more of the operational layers of the display may affect the propagation of light incident on the display to such extent that the display is observable. This may result in undesired visual perceptivity of the area covered by the display from the rest of the transparent panel area.

SUMMARY OF THE INVENTION

This summary is provided to introduce a selection of concepts in a simplified form that are further described below in the Detailed Description. This Summary is not intended to identify key features or essential features of the claimed subject matter, nor is it intended to be used to limit the scope of the claimed subject matter A transparent thin film display element with a display region having at least one emissive area, and a transition region having a first edge bordering the display region and a second edge opposite to the first edge, is disclosed.

The transparent display element has a layer stack comprising a first conductor layer, a second conductor layer, and at least one emissive layer superposed between the first and the second conductor layers and configured to emit light in the at least one emissive area when electrical current flows through the emissive layer between the first and the second conductor layers.

Advantageously, at least one layer of a group which comprises the first and the second conductor layers and the emissive layer has, in the transition region, a first coverage at the first edge, a second coverage lower than the first coverage at the second edge, and an intermediate coverage, which lies between the first and the second coverages, at a location between the first and the second edges.

Many of the attendant features will be more readily appreciated as the same becomes better understood by reference to the following detailed description considered in connection with the accompanying drawings.

BRIEF DESCRIPTION OF THE DRAWINGS

The present description will be better understood from the following detailed description read in light of the accompanying drawings, wherein:

FIG. 5 illustrates a flow chart of a method for manufacturing a transparent display element.

The drawings of FIGS. 1 to 4 are not in scale.

DETAILED DESCRIPTION

The detailed description provided below in connection with the appended drawings is intended as a description of a number of embodiments and is not intended to represent the only forms in which the embodiments may be constructed, implemented, or utilized.

Figure 1:
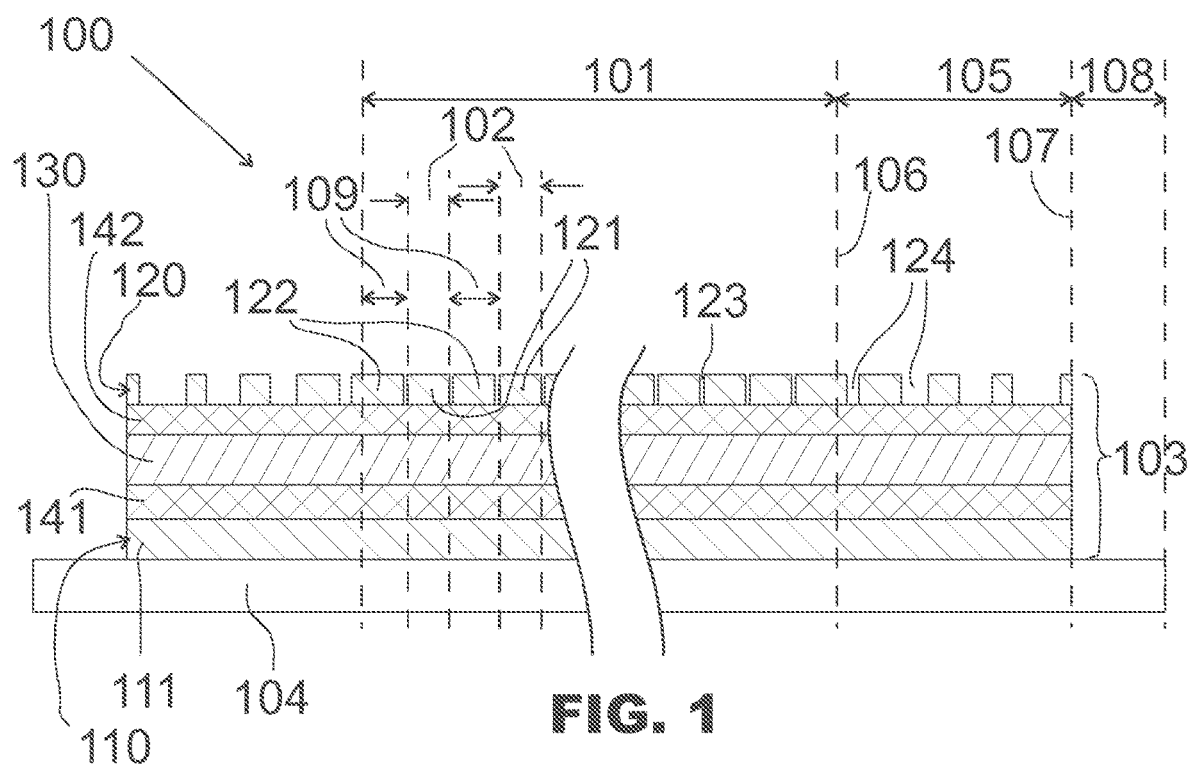
FIG. 1 illustrates schematically a sectional view of a transparent electroluminescent display panel.

The transparent thin film display element 100 of FIG. 1 has a display region 101 which in turn has a plurality of emissive areas 102. Other embodiments are possible where a display region comprises just one emissive area.

A "display region" refers to a predetermined area or region, observed or defined in the lateral direction of the display element 100, in which display region the emissive areas 102 are capable of emitting light to form the actual visual information to be displayed by the display element.

The display element 100 has a layer stack 103 superposed in a thickness direction of the display element, comprising actual operational layers extending in a lateral direction of the display element. The layer stack comprises: a first conductor layer 110; a second conductor layer 120; and an emissive layer 130 superposed between the first and the second conductor layers.

"Thin film" refers to the total thickness of the layer stack 103 of the operational layers having a thickness less than or equal to 10 µm. Individual layers may have thicknesses, for example, in the range of a few nanometers to some hundreds of nanometers or some micrometers.

"Conductor" refers to electrical conductor and electrical conductivity thereof. "Conductive" correspondingly refers to electrically conductive materials or structures.

"Transparent" refers to optical transparency of the display element and the layers, parts and materials thereof in the relevant wavelength range at issue. In other words, "transparent" material or structure refers to a material or structure allowing light, or generally electromagnetic radiation, at such relevant wavelength range to propagate through such material or structure. The relevant wavelength range may depend on the application where the transparent display element is to be used. In some embodiments, the relevant wavelength range may be the visible wavelength range of about 390 to about 700 nm.

Further, the transparency of the transparent display element 100 and the parts thereof primarily refers to the transparency in the thickness direction of the transparent display element. Thus, in order to be "transparent", sufficient portion of light energy incident on the transparent display element or a part thereof shall propagate through it in the thickness direction and exit it substantially in the initial direction thereof. Such sufficient portion may depend on the application in which the transparent display element is to be used. For some applications, such portion may be, for example, at least 70 or 90% of the energy of light incident perpendicularly on the transparent display element, at a location where the entire layer stack of the operational layers is present.

Said maintaining of the initial direction of propagation also after having propagated through the display element, without being significantly diffused or scattered, refers to optical clarity of the transparent display element.

The first and the second conductor layers are patterned so as to have elongated conductor traces 111, 121, the conductor traces of the different layers extending in different directions, for example, perpendicularly relative to each other.

The conductor traces 111, 121 serve as electrodes for supplying voltage and/or current, in the thickness direction of the display element, through the emissive layer between the first and the second conductor layers 110, 120. The emissive layer is configured emit light in the emissive 102 areas upon electrical current flowing through the emissive layer between the first and the second transparent conductor layers.

In the example of FIG. 1, the conductor traces 111, 121 define the emissive areas 102 to lie at the locations where the conductor traces 111, 121 of the first and the second conductor layers 110, 120 intersect. The display element 100 of FIG. 1 may thereby form, for example, a matrix type display element with emissive pixels formed at those intersections. In other embodiments, first and second conductor layers may be patterned in another way so as to have conductor patterns different from the conductor traces of the example of FIG. 1. For example, those layers may comprise conductor patterns of same shape and size superposed as aligned on each other. Such configuration may be implemented, for example, so as to form a segment type display element. Also in such and possible yet other types of configurations, emissive areas may be defined to exist at locations where there are electrodes formed by conductor patterns present in both conductor layers.

In the example of FIG. 1, the transparent thin film display element is an inorganic thin film electroluminescent display TFEL element. The layer stack 103 thereof comprises further a first transparent dielectric layer 141 between the first conductor layer 110 and the emissive layer 130, and a second dielectric layer 142 between the emissive layer 130 and the second conductor layer.

The entire layer stack 103 of the transparent display element 100 is formed and lies on a transparent substrate 104 formed of glass, such as sodalime or aluminosilicate glass, or some other suitable material such as any other appropriate transparent glass or plastic. Possible plastic materials include, for example, polyethylene PE, and polycarbonate PC, without being limited to these examples.

The transparent display element, including the substrate 104 thereof, may be formed as a flexible and/or bendable structure enabling attaching or laminating thereof on a curved, or any freely shaped three dimensional surface.

Basically, an inorganic thin film electroluminescence/electroluminescent ("EL") display element generally comprises a dielectric layer—luminescent layer—dielectric layer positioned between a first and a second conductive electrode layers. In the example of FIG. 1, the emissive layer 130 thus represents the luminescent layer, and the first and the second conductor layers 110, 120 serve as the first and the second conductive electrode layers.

In operation, with suitable electric field provided in the luminescent layer by supplying a voltage difference between the conductive electrode layers, electrons are discharged into the luminescent layer, giving rise to light emission as luminescence centers excited by the electrons return to their ground state. At a general level, the operation of EL displays is thus based on a luminescent material that emits light when exposed to an external electric field. The luminescent layer and/or the light emitting material thereof may also be called "phosphor".

The emissive layer 130 as the luminescent layer may comprise, for example, manganese doped zinc sulfide ZnS:Mn as the luminescent material. Naturally, also other luminescent materials are possible.

The first and the second dielectric layers 141, 142 may comprise, for example, antimony tin oxide ATO or any other appropriate dielectric material.

The first and the second conductor layers 110, 120 may comprise, for example, indium tin oxide ITO, aluminum doped zinc oxide ATO (ZnO:Al), or any other appropriate transparent conductive oxide TCO or other transparent conductor material.

In other embodiments, any of the emissive layer, the first and the second dielectric layers, and the first and the second conductor layers may comprise a plurality of sublayers of different materials or compositions.

In inorganic EL displays provided as thin film structures, the luminescent material is arranged as a thin luminescent layer generally having a thickness of less than 1000 nanometers, typically approximately 500-750 nanometers. For low voltage applications, the thickness may be also lower.

The basic technology of EL displays is generally known and has been described extensively e.g. in "Electroluminescent Displays" (Yoshimasa A. Ono, World Scientific Publishing Co., 1995 (ISBN 981-02-1920-0) in Chapters 3, 5 and 8.

The display element 100 further has a transition region 105 having a first edge 106 bordering the display region 101, i.e. lying adjacent to and being defined by the display region, and a second edge 107 opposite to, and at a distance from, the first edge. The transition region 105 thus has a width defined by the distance between the first and the second edges thereof.

The first and the second dielectric layers 141, 142 and the emissive layer 130 extend as continuous structures covering the entire display region 101 and also the transition region of the transparent display element. Their possible effect on the visual perceptivity or visibility of the transparent display element is therefore uniform throughout the display region 101.

In the example of FIG. 1, the first and the second conductor layers 110, 120 comprise, in addition to the conductor traces 121 thereof, also passive conductor elements 122 (the passive conductor elements of the first conductor layer being not visible in the drawing of FIG. 1) outside the emissive areas 102 defined by the conductor traces 111, 121. The passive conductor elements define passive areas 109 in the display region, i.e. areas not capable of emitting light.

"Passive" conductor element refers to a pattern of a conductor layer which is not to be electrically connected to any contact arrangement for connecting the conductor layer to an external electrical power supply. Such passive conductor element thus is, in electrical point of view, a "passive" structure in the sense that is does not participate in the electrical or light emissive operation of the display element.

The passive conductor elements 122 enable the first and the second conductor layers 110, 120 to cover a major part of the display region 101. There may be just small gaps 123 (gaps of the first conductor layer being not visible in the drawing of FIG. 1) having a width, for example, of some tens of micrometers present between the conductor traces 111, 121, and the passive conductor elements 122. The passive conductor elements and the conductor traces of a conductor layer may cover, for example at least 80% of the area of the display region.

With such major part of the display region being covered by the first and the second conductor layers, the optical structure and thus the visual appearance of the display region may be very uniform.

In the transition region 105, the second conductor layer 120 has a plurality of holes 124 formed through it in the thickness direction. The width of the holes 124 increases gradually towards the second edge 107 of the transition region so that coverage of the second conductor layer 120 gradually decreases between the first edge 106, where there is a first coverage, and the second edge 107 of the transition region 105, where there is a second coverage which is lower than that of the first coverage.

"Coverage" of a layer refers to the portion which the layer covers of a specific area. For example, in the case of the second conductor layer 120 of the example of FIG. 1, when observing an area in the transition region which area comprises a plurality of holes, the coverage of the second conductor layer in that area is the portion of that area which is covered by the material of the second conductor layer outside the holes.

In other embodiments, instead of a continuously or gradually changing coverage of the second conductor layer, there may be just one or more discrete intermediate coverage levels, with step-wise changes therebetween, between the first and the second edges of a transition region.

The holes may be advantageously so dimensioned that at a usual observation distance of the application at issue, they are not visible for a human eye. Such observation distance may be different in different application. For example, in applications where a display element is incorporated within or on a vehicle or a working machine window or windscreen, it may lie, for example, in the range of 50 to 100 cm. In other words, they may have dimensions below the average human eye angular resolution. For example, the holes may have their diameters in the range of 30 to 500, for example, in the range of 100 to 500 μm.

In other embodiments, instead of, or in addition to, the size or the width or diameter of the holes, a factor chancing the coverage of the second conductor layer in a transition layer of a transparent display element may be the concentration of the holes. Then, the concentration of the holes may be higher at the second edge of the transition region than at the first edge thereof. Similarly to an increasing hole size, also increasing the hole concentration decreases the coverage of the first conductor layer towards the second edge of the transition region.

"Concentration" of objects, such as holes in a layer, refers to the spatial frequency of occurrence of such objects. Thus, the higher is the concentration the lower is the average distance between adjacent objects.

In the display element 100 of FIG. 1, there is a boundary region 108 bordering the transition region 105. In the boundary region, the second conductor layer does not exist. The coverage thereof is thus zero. In the example of FIG. 1, actually the entire layer stack 103 is absent in the boundary region 108.

It is to be noted that the illustration of FIG. 1 represents the structure of the display element at one cross sectional plane thereof. Thus, the structure may be different at different cross sectional planes. For example, at the location(s) where the conductor traces or some additional conductor elements connected to them are led to the outside of the display region 101 to enable connection thereof to an external power supply, the cross sectional structure may differ from that of illustrated in FIG. 1.

In the example of FIG. 1, the display region forms a uniform, unbroken "island", and the transition region surrounds, at least partially, the display region. In other embodiments, different configurations are possible. For example, a transition region may border only a part of a display region, i.e. be adjacent to only a part of an edge of a display region, not substantially surrounding or encircling it. Further, a display region may have any shape such as a ring, and a display region itself may be patterned so as to have one or more holes therein. Correspondingly, a transition regions may then border, partially or entirely, one or more edges of such display regions.

The decrease in the coverage of the second conductor layer between the first and the second edges of the transition layer may advantageously make the display region of the display element visually less striking. In other words, the difference between the visual appearance of the display element and the area outside of it, or of the display region and the boundary region, may become more imperceptible in comparison to a display element where the second conductor layer region is cut abruptly cut off at the edge of the display region. Said effect may be advantageous, for example, in applications where a display element of a limited size is integrated within or onto a larger transparent base plate, the display element covering only a part of such base plate.

In the example of FIG. 1, only the second conductor layer 120 is patterned in the transition region 105 so as to have a changing coverage. In other embodiments, instead of, or in addition to, the second conductor layer, coverage of the first conductor layer and/or the emissive layer 130 may be patterned so as to have a changing coverage in the transition region. In one embodiment, an example of which being illustrated in FIG. 2, all those three layers may have their coverages changing between the first and the second edges of the transition region.

Several, i.e. two or more, layers having a changing coverage in the transition region may further increase said advantageous effect of making the display region, or actually the area(s) thereof outside the emissive areas and also the emissive area(s) when not emitting light, less visible.

In other embodiments, instead of, or in addition to holes illustrated in the example of FIG. 1, a changing coverage of a layer of a display element may be achieved by a layer patterned in a transition region so as to have discrete islands with their size and/or concentration decreasing, gradually or step-wise, from the first edge of the transition region towards the second edge thereof. One example of this is illustrated in FIG. 2.

In the example of FIG. 1, the second conductor layer has a full coverage, thus a coverage of 100% at the first edge 106 thereof. A full coverage refers to no patterning existing at the first edge but the patterning starting only at a distance therefrom. On the other hand, a "full coverage" does not necessitate such coverage to exist for the entire periphery of the display region, or even for the entire length thereof where there is a transition region bordering the display region. Instead, such coverage may also exist only for a part of the circumference of the display region or for a part of the length of the transition region only.

Both holes and islands as features used to adjust the coverage of a layer of a display element may have any appropriate shape. They may be circular, rectangular, pentagons, etc., or they may have any other appropriate shape which may depend, for example, on the equipment and process used to pattern the layer.

Figure 2:
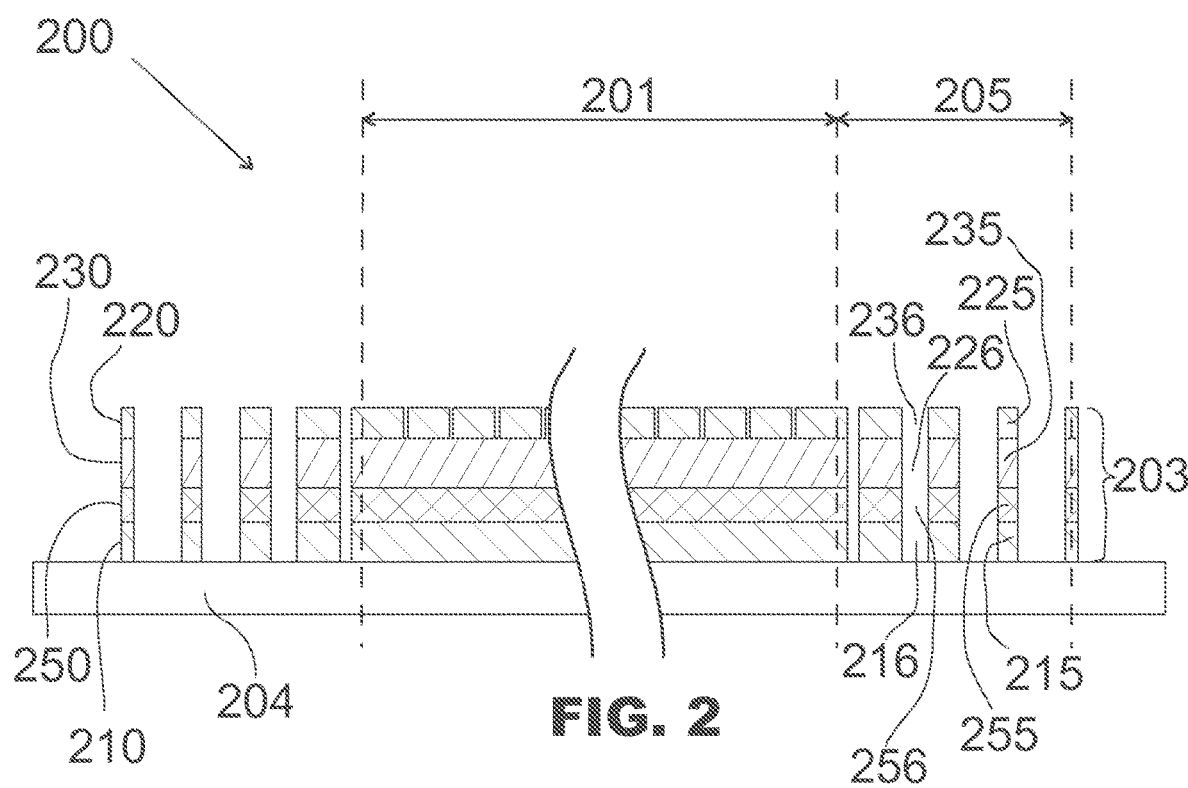
FIG. 2 illustrates schematically a sectional view of a transparent organic light emitting diode OLED display panel.

The display element 200 of FIG. 2 differs from that of FIG. 1 first in that it is a thin film organic light emitting diode OLED display element. With regard to the chancing coverage of the layers of the layer stack 203 in the transition region 205, the principles and implementations discussed below may be applied also in other embodiments with different types of display elements, such as thin film electroluminescent display elements which may be basically in accordance with that of FIG. 1. Vice versa, the principles of implementing the changing coverage of one or more layers in the transition region discussed above with reference to FIG. 1 may be utilized in an OLED display element basically in accordance with that of FIG. 2.

The layer stack 203 of the display element 200 comprises an emissive layer 230 and a current transport layer 250 between the first and second conductor layers 210, 220 forming the electrodes of the matrix type display element. The current transport layer of an OLED may also be called a "conductive/conducting layer". In other embodiments, OLED display elements with different layer configurations are possible. For example, there may be a hole transport layer and an electron transport layer on the opposite sides of an emissive layer.

All the emissive layer 230 (and the current transport layer 250) and the first and the second conductor layers 210, 220 are patterned in the transition region 205 so as to have discrete islands 235, 215, 225, 255 separated by gaps 236, 216, 226, 256 therebetween. The gaps of a cross-section of a layer may be connected to each other so that they form a larger, continuous space extending in that layer. In the example of FIG. 2, the islands and the gaps of the different layers are of the same sizes and positioned aligned on top of each other. In other embodiments, different arrangements are possible.

The size of the discrete islands decreases towards the second edge of the transition region. Thereby, those layers have a first coverage at the first edge, a second coverage lower than the first coverage at the second edge, and several intermediate coverages, which lie between the first and the second coverages, at locations between the first and the second edges of the transition region 205.

Thus, differently from the holes of the example of FIG. 1, in the example of FIG. 2, discrete islands are used as features by which the coverage of the different layers in the transition region is adjusted.

In other embodiments, instead of, or in addition to, the size of islands, it is possible to have their concentration decreasing between the first and the second edges of a transition region.

The discrete islands and/or the gaps remaining therebetween may be advantageously so dimensioned that at a usual observation distance of the application at issue, they are not visible for a human eye. In other words, they may have dimensions below the average human eye angular resolution. For example, the islands may have their diameters, and/or the gaps remaining between the islands may have their widths, in the range of 30 to 500, for example, in the range of 100 to 500 μm.

In other embodiments, any of the arrangements discussed above with reference to FIG. 2, where the changing coverage a layer is achieved by discrete islands, may be utilized in an electroluminescent display element or in any other display element type with a first and a second conductor layer and an emissive layer therebetween. On the other hand, any of the arrangements discussed above with reference to FIG. 1, where the changing coverage of a layer is achieved by holes through layer, may be utilized in an organic light emitting diode display element or in any other display element type with a first and a second conductor layer and an emissive layer therebetween.

Further, with regard to the layer with a changing coverage in the transition region, possible embodiments are not limited to those examples of FIGS. 1 and 2. In various embodiments, in the transition region of a transparent thin film display element, there may be a patterning with holes and/or discrete islands resulting in a changing coverage in the transition region i) in the second conductor layer only; ii) in the second conductor layer and in the first conductor layer; iii) in the second conductor layer and in the emissive layer; iv) in the second conductor layer, in the first conductor layer, and in the emissive layer; v) in the first conductor layer only; v) in the first conductor layer and in the emissive layer; or vi) in the emissive layer only. In any of such embodiments, the display element may be an electroluminescent display element, an organic light emitting diode display element, or a display element or any other appropriate type having a first conductor layer, a second conductor layer, and an emissive layer between the first and the second conductor layers, configured to emit light when current flows through it between the first and the second conductor layers.

It may also be possible that in some embodiments, one or more dielectric layers of a display element have a changing coverage in the transition layer of the display element.

Figure 3:
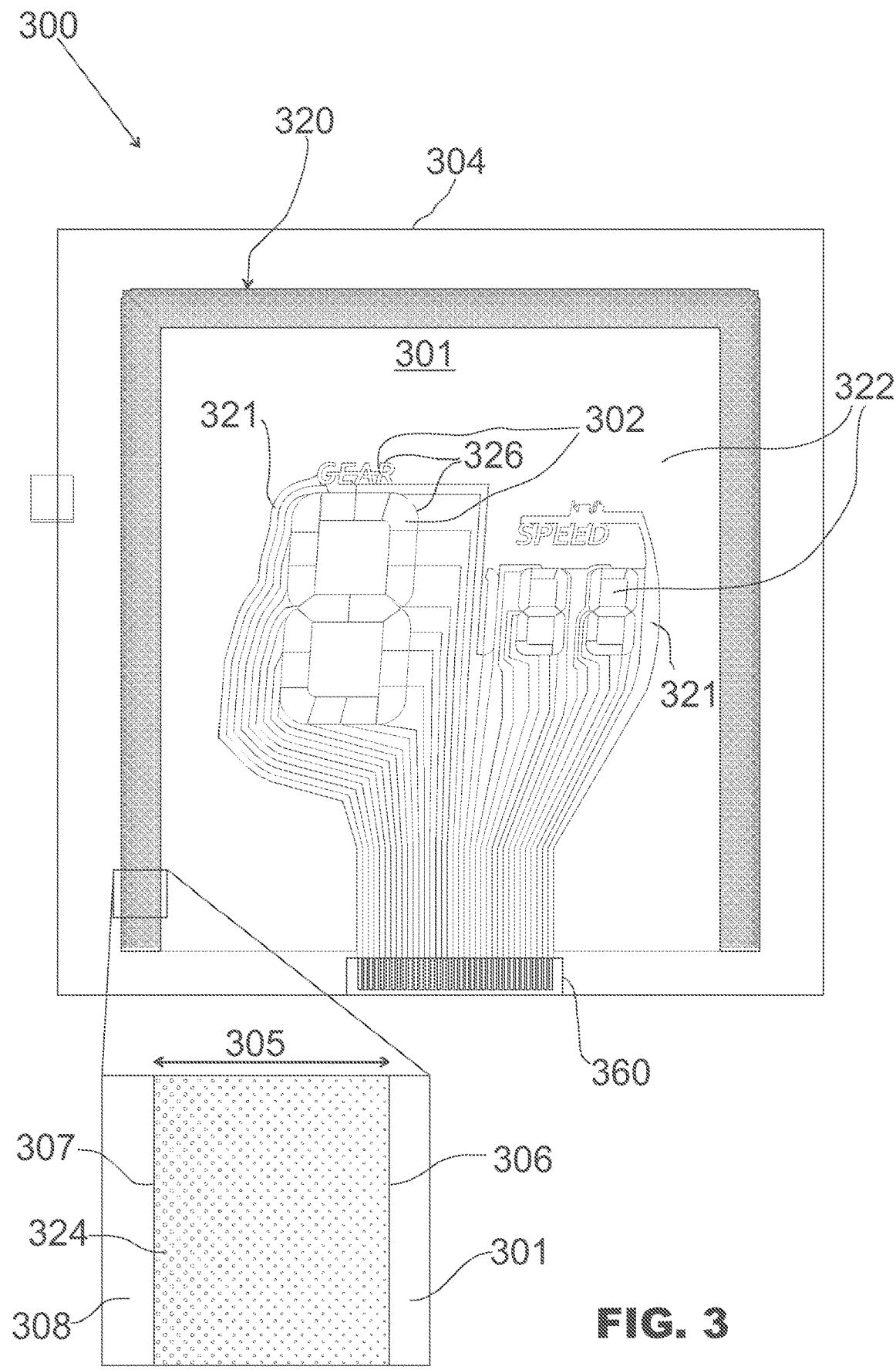
FIG. 3 illustrates a front view of a transparent display element.

Differently from the Examples of FIGS. 1 and 2, in the example of FIG. 3, the display element 300, the second conductor layer 320 of which is visible in the front view of FIG. 3, is a segment type display element.

The display element 300 of FIG. 3 may be an inorganic electroluminescent display element, an organic light emitting diode display element, or a display element of any other appropriate type having a first conductor layer, a second conductor layer, and an emissive layer between the first and the second conductor layers, the emissive layer being configured to emit light when current flows through it between the first and the second conductor layers.

The layer stack with the second conductor layer 320 is formed on a transparent substrate plate 304.

Thus, instead of intersecting conductor traces, the electrodes of the display element 300 are formed by conductor segments 326 of the second conductor layer 320, and complementary conductor segments of the first conductor layer which is not visible in the drawing of FIG. 3. Those conductor segments define the segment-type emissive areas 302 of the display element in the form of letters, numbers, and parts thereof. There are also conductor traces 321 in the display region 301, serving for electrical connecting paths of the conductor segments only, enabling connecting the conductor segments to an external power supply.

In the display region 301, outside the emissive areas, the second conductor layer 320 comprises passive conductor elements 322 filling the majority of the display region area outside the conductor traces.

The conductor patterns, i.e. the conductor traces, conductor segments, and passive conductor elements, are separated from each other by narrow gaps to prevent short circuiting between them. Due to the line width required to illustrate the shapes of those conductor patterns, those gaps are not distinguishable in the drawing of FIG. 3.

A transition region 305 surrounds the display region, except of the area where the conductor traces 321 are led to the outside of the display region, to a connector arrangement 360 lying at the edge of the display element. A boundary region 308 correspondingly surrounds the transition region.

In the transition region 305, the second conductor layer 320 comprises through holes 324 therein, the size of the holes increasing from the first edge 306 towards the second edge 307 of the transition region. Thereby, the coverage of the second conductor layer at or close to the second edge 307 is lower than the coverage thereof at or close to the first edge 306 of the transition region 305. Several levels of intermediate coverages are present between those extremes, located between the first and the second edges. The coverage may be considered changing step-wise or substantially continuously, thus gradually.

In the example of FIG. 3, in the boundary region 308, the coverage of the second conductor layer is zero.

In other embodiments, any of the alternative patterning arrangements discussed above with reference to FIGS. 1 and 2 may be present in the second conductor layer of a display element to adjust the coverage thereof in the transition region. For example, holes with a changing concentration, or, instead of holes, discrete islands with changing size and/or concentration, may be used as features for adjusting the coverage of the second conductor layer in the transition region.

Above, configuration of the second conductor layer 320 is discussed. The first conductor layer and/or the emissive layer, which are not visible in the drawing of FIG. 3, may have similar or corresponding configuration(s). For example, they may have holes in the transition region, located aligned with the holes of the second conductor layer. In other embodiments, instead of the second conductor layer, there may be changing coverage in the transition region of a display element in the first conductor layer and/or in the emissive layer only.

Figure 4:
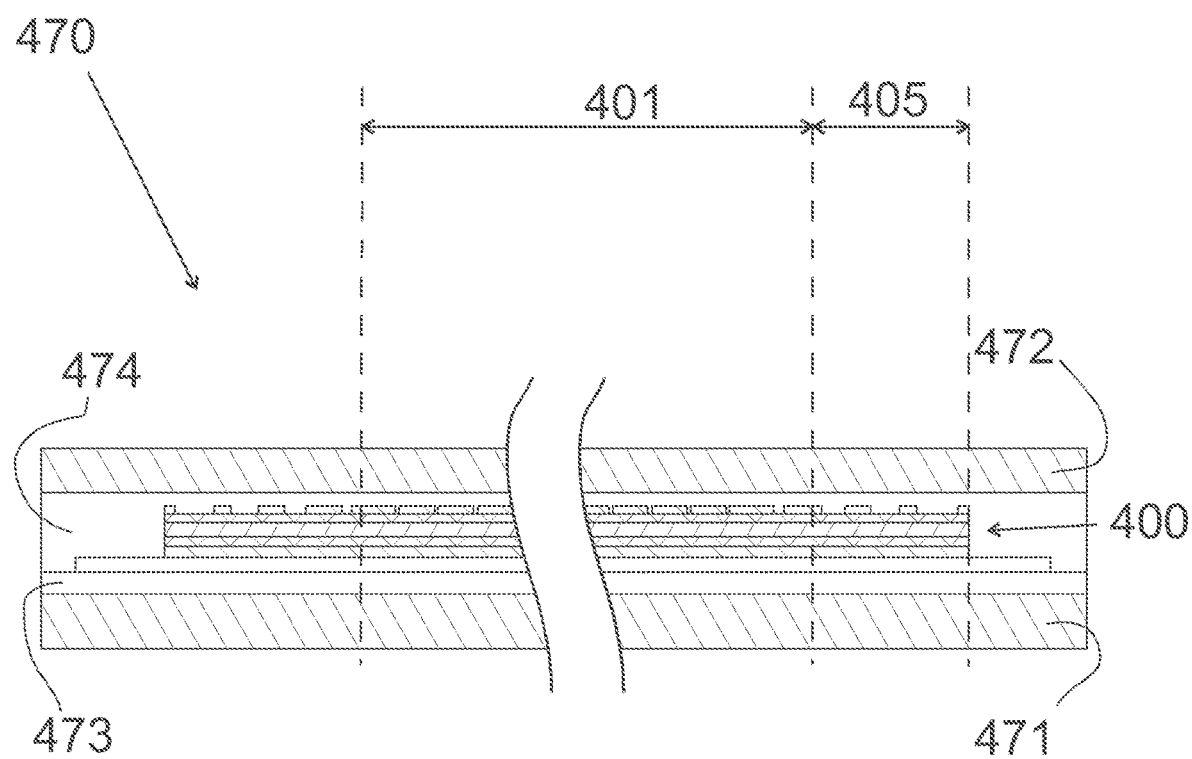
FIG. 4 illustrates a schematic sectional view of a window panel.

The window panel 470 of FIG. 4 comprises a transparent display element 400 which may be in accordance with any of those discussed above with reference to FIG. 1. In other embodiments, window panels may be implemented with transparent display elements in accordance with any of those discussed above with reference to FIGS. 2 and 3.

The transparent display element 400 is attached on a transparent base plate 471, and laminated between the transparent base plate and a transparent cover plate 472. The base and the cover plates extend to the outside of the display region 401 and the transition region 405 of the display element.

In other embodiments, window panels may be implemented without a cover plate. In yet other embodiments, window panels may be implemented without any transparent base film, with a transparent display element attached on a transparent cover plate.

In the example of FIG. 4, the attachment and the lamination are made by a first and a second layer 473, 474 of an optically clear adhesive OCA material. In other embodiments, other attachment and lamination configurations are possible.

Any of the base and cover plates may comprise any appropriate transparent plastic or glass material, such as any of those discussed above as possible materials for the transparent substrate of the transparent display element.

In one embodiment, the window panel is implemented as a window or windscreen for a vehicle such as a bus, tractor, car, or a truck. In other embodiments, window panels may be implemented, for example, as heads up display HUD arrangements, as architectural windows, as advertising windows, or in window panels for user interface panels.

Instead of a transparent window panel, implementations are possible with a transparent display element attached on an opaque base plate.

Above, mainly structural and material aspects of transparent display elements and their applications are discussed. In the following, more emphasis will lie on manufacturing aspects related to transparent display elements. What is discussed above about the ways of implementation, definitions, details, and advantages related to the structural and material aspects apply, mutatis mutandis, to the method aspects discussed below. The same applies vice versa.

The methods discussed below may be used to manufacture any of the transparent display elements discussed above. On the other hand, the transparent display elements discussed above represent examples of various transparent display elements which may be manufactured by the methods discussed below.

The method 500 of FIG. 5 may be used to manufacture a transparent thin film display element with a display region having at least one emissive area, and a transition region having a first edge bordering the display region and a second edge opposite to the first edge. The display element formed in the method may be, for example, an inorganic electroluminescent display element or an organic light emitting diode OLED display element.

The method 500 of FIG. 5 comprises forming, on an appropriate transparent substrate, a layer stack of operation display element layers. Forming said layer stack comprises forming, in step 501, a first conductor layer on the substrate. Any appropriate deposition of other type of layer formation process, such as sputtering or atomic layer deposition ALD, may be used in said forming.

"Atomic layer deposition ALD" refers to a thin film technology enabling accurate and well controlled production of thin film coatings with nanometer-scaled thicknesses. ALD may also be called Atomic Layer Epitaxy ALE. In an ALD process, the substrate is alternately exposed to at least two precursors, one precursor at a time, to form on the substrate a coating by alternately repeating essentially self-limiting surface reactions between the surface of the substrate (on the later stages, naturally, the surface of the already formed coating layer on the substrate) and the precursors. As a result, the deposited material is "grown" on the substrate molecule layer by molecule layer.

In step 502, an emissive layer is formed on the first conductor layer. Again, any appropriate process, such as sputtering, may be utilized.

In step 503, a second conductor layer is formed on the emissive layer, using, for example, the same process(es) by which the first conductor layer was formed.

Forming a layer "on" another layer or some other existing structure does not necessitate forming it directly on, i.e. so as to have a direct contact with, that other layer or structure, but there may be any appropriate intermediate layer(s) and structure(s) therebetween.

As an important feature of the method, at least one layer of a group comprising the first and the second conductor layers and the emissive layer is formed so as to have, in the transition region, a first coverage at the first edge, a second coverage lower than the first coverage at the second edge, and an intermediate coverage, which lies between the first and the second coverages, at a location between the first and the second edges.

Said different coverages of the at least one layer in the transition region may be achieved by utilizing any appropriate patterning technique. For example, a conductor layer may be patterned, for example, using the same lithographic process(es) by which the patterned electrodes of electroluminescent or OLED display elements are typically used. Such patterning process may comprise several stages, such as cleaning, drying, photoresist coating, pre-baking, exposure, developing, etching and stripping with cleaning/drying steps. For example, lithographic patterning for ITO as the material of a conductor layer may be carried out with automated photo-lithography in-line tool utilizing wet chemical processes. The selected etchant, which may be e.g. a mixture of HCl and $HNO_3$ acids, removes the desired areas of the conductor layer.

On the other hand, for example, a luminescent layer of an electroluminescent display element as the emissive layer may also be patterned lithographically. For example, wet chemical processes similar to those commonly known for patterning conductor layers may be used. Suitable etchants for dissolving a luminescent layer (typically ZnS) include HCl acid or a mixture of HCl and $HNO_3$ acids. In some embodiments, an adhesion promoting layer may be used between the luminescent layer and photoresist. One example of suitable material for such adhesion promoting layer is $Al_2O_3$. Thickness of such adhesion promoting layer is preferably 1-50 nm, more preferably 5-15 nm, and most preferably 8-12 nm. One suitable etchant for dissolving such adhesion promoting layer is $H_3PO_4$ acid.

Such operations of a manufacturing method may be carried out, and/or a manufacturing method may comprise any appropriate further operations, so as to produce a transparent thin film display element, or a window panel in accordance with any of those discussed above with reference to FIGS. 1 to 4.

It is to be noted that the present invention is not limited to the embodiments and examples above. Instead, the embodiments of the present invention can freely vary within the scope of the claims.

It will be understood that the benefits and advantages described above may relate to one embodiment or example or may relate to several embodiments or examples. The embodiments and examples are not limited to those that solve any or all of the stated problems or those that have any or all of the stated benefits and advantages. It will further be understood that reference to 'an' item refers to one or more of those items.

The term "comprising" is used in this specification to mean including the feature(s) or act(s) followed thereafter, without excluding the presence of one or more additional features or acts.

The invention claimed is:

1. A transparent thin film display element with a display region having at least one emissive area, and a transition region having a first edge bordering the display region and a second edge opposite to the first edge, the transparent display element having a layer stack comprising:
    a first conductor layer;
    a second conductor layer; and
    an emissive layer superposed between the first and the second conductor layers and configured to emit light in the at least one emissive area upon electrical current flowing through the emissive layer between the first and the second conductor layers;
    at least one layer of a group comprising the first and the second conductor layers and the emissive layer having, in the transition region, a first coverage at the first edge, a second coverage lower than the first coverage at the second edge, and an intermediate coverage, which lies between the first and the second coverages, at a location between the first and the second edges.

2. A transparent display element as defined in claim 1, wherein, between the first and the second edges, the coverage of said at least one layer changes gradually from the first coverage to the second coverage.

3. A transparent display element as defined in claim 1, further having a boundary region bordering the second edge of the transition region, said at least one layer having a zero coverage in the boundary region.

4. A transparent display element as defined in claim 1, wherein said at least one layer covers at least 80% of the display region.

5. A transparent display element as defined in claim 1, wherein the display region has at least one passive area outside the at least one emissive area, said at least one layer being present in the at least one passive area.

6. A transparent display element as defined in claim 1, wherein, in the transition region, the at least one layer has a plurality of through holes, size and/or concentration of the holes being higher at the second edge than at the first edge of the transition region.

7. A transparent display element as defined in claim 1, wherein, in the transition region, the at least one layer comprises a plurality of discrete islands, size and/or concentration of the islands being lower at the second edge than at the first edge of the transition region.

8. A transparent display element as defined in claim 1, wherein the first coverage is 100%.

9. A transparent display element as defined in claim 1, wherein said at least one layer comprises the first and/or the second conductor layer.

10. A transparent display element as defined in claim 1, wherein said at least one layer comprises the emissive layer.

11. A transparent display element as defined in any of claims claim 1, implemented as a thin film inorganic electroluminescent TFEL display element.

12. A transparent display element as defined in claim 1, implemented as an organic light emitting diode OLED display element.

13. A window panel comprising a transparent base plate, and a transparent display element as defined in claim 1 attached on the transparent base plate, the transparent base plate extending to the outside of the display region and the transition region of the display element.

14. A window panel as defined in claim 13, further comprising a transparent cover plate, the transparent display element being laminated between the transparent base and cover plates.

15. A method for manufacturing a transparent thin film display element with a display region having at least one emissive area, and a transition region having a first edge bordering the display region and a second edge opposite to the first edge, the method comprising forming a layer stack, said forming comprising:

forming a first conductor layer;

forming a second conductor layer; and forming an emissive layer superposed between the first and the second conductor layers and configured to emit light in the at least one emissive area upon electrical current flowing through the emissive layer between the first and the second conductor layers;

at least one layer of a group comprising the first and the second conductor layers and the emissive layer being formed so as to have, in the transition region, a first coverage at the first edge, a second coverage lower than the first coverage at the second edge, and an intermediate coverage, which lies between the first and the second coverages, at a location between the first and the second edges.

\* \* \* \* \*